(12) United States Patent
Guilford et al.

(10) Patent No.: US 12,074,618 B2
(45) Date of Patent: Aug. 27, 2024

(54) FLEXIBLE COMPRESSION HEADER AND CODE GENERATION

(71) Applicant: Intel Corporation, Santa Clara, CA (US)

(72) Inventors: James Guilford, Northborough, MA (US); Vinodh Gopal, Westborough, MA (US); Daniel Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 734 days.

(21) Appl. No.: 17/128,787

(22) Filed: Dec. 21, 2020

(65) Prior Publication Data

US 2022/0200626 A1    Jun. 23, 2022

(51) Int. Cl.
*H03M 7/42* (2006.01)
*G06F 9/46* (2006.01)
*H03M 7/30* (2006.01)

(52) U.S. Cl.
CPC .............. *H03M 7/42* (2013.01); *G06F 9/461* (2013.01); *H03M 7/3086* (2013.01)

(58) Field of Classification Search
CPC ............ H03M 7/42; H03M 7/30; H03M 7/46; H03M 7/40; H03M 7/3086; H03M 7/4043
See application file for complete search history.

(56) References Cited

U.S. PATENT DOCUMENTS

| | | | | |
|---|---|---|---|---|
| 10,558,572 B2* | 2/2020 | Mola | ..................... | G06F 11/3636 |
| 11,200,186 B2* | 12/2021 | Fleming, Jr. | ........ | G06F 13/4027 |
| 11,308,962 B2* | 4/2022 | Smith | ..................... | G06F 3/165 |
| 11,482,224 B2* | 10/2022 | Smith | ..................... | G10L 15/22 |
| 2005/0131930 A1* | 6/2005 | Jang | ................. | H04N 21/44012 |
| 2007/0109153 A1* | 5/2007 | Ma | ......................... | H03M 7/40 341/50 |
| 2013/0135121 A1* | 5/2013 | Glass | ................... | H03M 7/6076 341/65 |
| 2014/0233376 A1* | 8/2014 | Yu | ......................... | H04W 28/06 370/230 |
| 2019/0238894 A1* | 8/2019 | Jun | ....................... | H04N 19/423 |
| 2019/0391869 A1* | 12/2019 | Gopal | ................. | G06F 11/1004 |
| 2020/0099958 A1* | 3/2020 | Satpathy | ................ | H04N 19/13 |
| 2020/0105021 A1* | 4/2020 | Sohre | ........................ | G06T 1/60 |
| 2020/0284883 A1* | 9/2020 | Ferreira | ................ | G01S 7/4816 |
| 2020/0326910 A1* | 10/2020 | Parikh | ..................... | H03M 7/40 |
| 2021/0288859 A1* | 9/2021 | Radosevic | ............ | H03M 13/27 |
| 2022/0224361 A1* | 7/2022 | Alic | ................. | H03M 13/2957 |
| 2022/0273907 A1* | 9/2022 | Poltorak | ................. | G06F 3/015 |

(Continued)

OTHER PUBLICATIONS

Extended European Search Report from European Patent Application No. 21194682.7 notified Feb. 25, 2022, 9 pgs.

(Continued)

*Primary Examiner* — Lam T Mai

(74) *Attorney, Agent, or Firm* — Essential Patents Group, LLP

(57) ABSTRACT

An embodiment of an integrated circuit may comprise a hardware compressor to compress data, the hardware compressor including circuitry to store input data in a history buffer, compute one or more code tables based on the input data, and compute a compression stream header based on the computed one or more code tables. Other embodiments are disclosed and claimed.

21 Claims, 14 Drawing Sheets

(56) References Cited

U.S. PATENT DOCUMENTS

| | | | |
|---|---|---|---|
| 2023/0136071 A1* | 5/2023 | Evans | G06F 18/24323 |
| | | | 706/20 |
| 2023/0237480 A1* | 7/2023 | Miller | G06F 21/31 |
| | | | 705/75 |
| 2023/0269148 A1* | 8/2023 | Foo | H04L 43/04 |
| | | | 709/224 |

OTHER PUBLICATIONS

Office Action from European Patent Application No. 21194682.7 notified Nov. 28, 2023, 4 pgs.

* cited by examiner

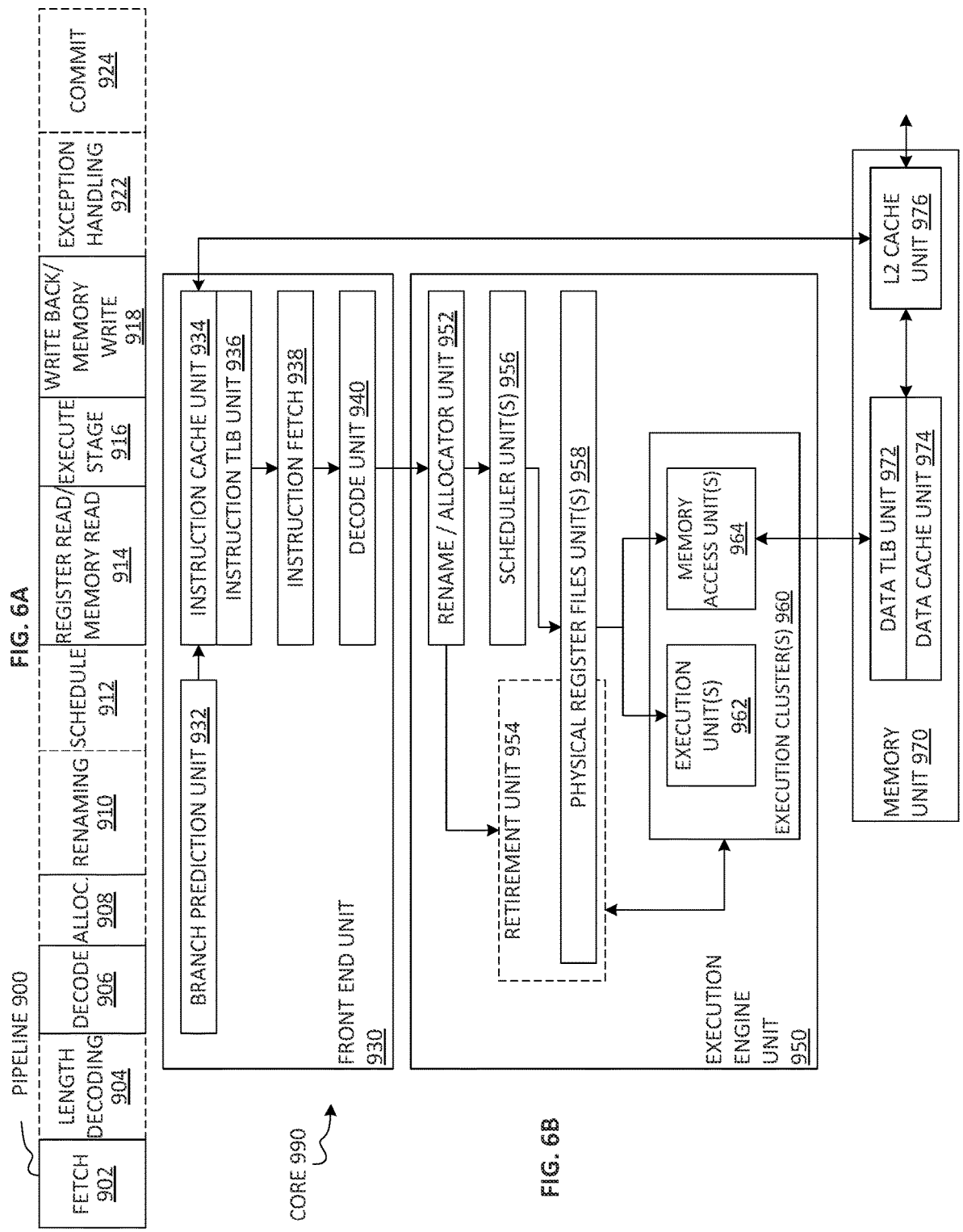

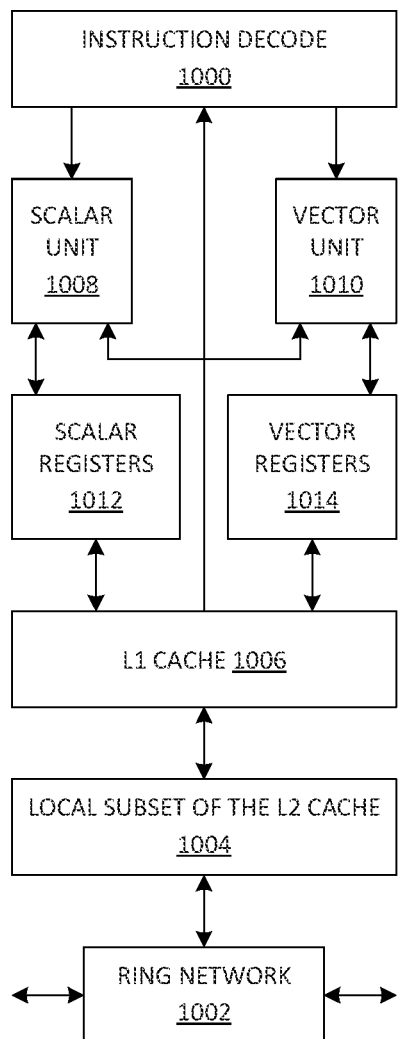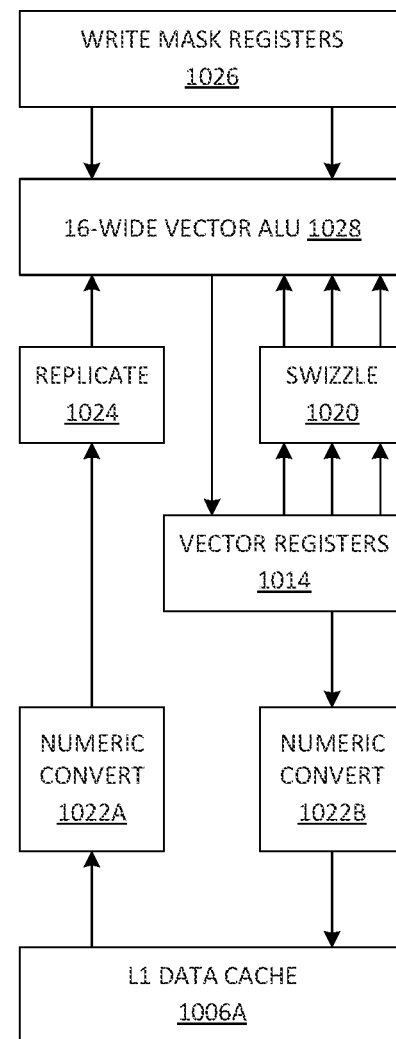
FIG. 7A
FIG. 7B

FLEXIBLE COMPRESSION HEADER AND CODE GENERATION

BACKGROUND

1. Technical Field

This disclosure generally relates to data compression technology, and hardware compression technology.

2. Background Art

The DEFLATE compression algorithm is a general-purpose compression algorithm (e.g., implemented in ZLIB, GZIP, etc.). DEFLATE is based on the LZ77 algorithm for finding data matches, and DEFLATE encodes the LZ77 output with Huffman encoded symbols. The compressed stream is composed of a series of blocks, where the block header defines the Huffman tables to be used in that block. In most cases, the Huffman codes are optimized for the contents of the block. This means that there needs to be two passes through the data: one to compute the statistics of the block's data, and one to do the actual compression. Between these two passes, calculations are made to compute a set of Huffman codes based on the statistics from the first pass.

BRIEF DESCRIPTION OF THE DRAWINGS

The various embodiments of the present invention are illustrated by way of example, and not by way of limitation, in the figures of the accompanying drawings and in which:

FIG. 6A is a block diagram illustrating both an exemplary in-order pipeline and an exemplary register renaming, out-of-order issue/execution pipeline according to embodiments of the invention.

FIG. 6B is a block diagram illustrating both an exemplary embodiment of an in-order architecture core and an exemplary register renaming, out-of-order issue/execution architecture core to be included in a processor according to embodiments of the invention;

FIGS. 7A-B illustrate a block diagram of a more specific exemplary in-order core architecture, which core would be one of several logic blocks (including other cores of the same type and/or different types) in a chip;

DETAILED DESCRIPTION

Figure 1:
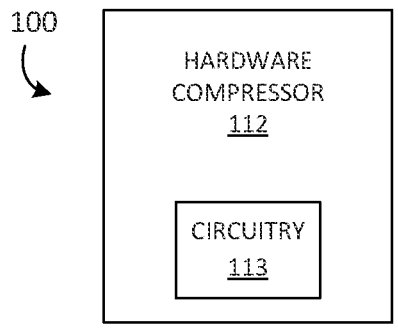
FIG. 1 is a block diagram of an example of an integrated circuit according to an embodiment.

Embodiments discussed herein variously provide techniques and mechanisms for hardware compression. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including integrated circuitry which is operable to provide hardware compression.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

With reference to FIG. 1, an embodiment of an integrated circuit 100 may include a hardware compressor 112 to compress data. The hardware compressor 112 may include circuitry 113 to store input data in a history buffer, compute one or more code tables based on the input data, and compute a compression stream header based on the computed one or more code tables. In some embodiments, the circuitry 113 may be configured to provide multiple modes of operation for the hardware compressor 112. In one mode of operation (e.g., a one-descriptor mode), for example, the circuitry 113 may be configured to store an entire set of job data in the history buffer in response to a single job for the hardware compressor 112 where a size of the job data is less than or equal to a size of the history buffer, compute the one or more code tables for the job data in response to the single job, compute the compression stream header based on the computed one or more code tables for the job data in response to the single job, and generate compressed output data for the job data stored in the history buffer based on the computed one or more code tables and the computed compression stream header in response to the single job. In one mode of operation (e.g., a two-descriptor mode), the circuitry 113 may be configured to store the computed one or more code tables and the computed compression stream header to memory in response to a first job for the hardware compressor 112 with job data that exceeds a size of the history buffer, and generate compressed output data for the job data based on the stored one or more code tables and the stored compression stream header in response to a second job for the hardware compressor.

In some embodiments, in one mode of operation (e.g., a statistics-read mode), the circuitry 113 may be further configured to read statistics from the input data, and compute the one or more code tables and the compression stream header based on the read statistics. In one mode of operation (e.g., a no-header mode), for example, the circuitry 113 may be configured to output the computed one or more code tables without the compression stream header. In one mode of operation (e.g., a complete-tree mode), for example, the circuitry 113 may be configured to replace a count of zero for a possible token with a non-zero value. In some embodiments, in one mode of operation (e.g., a hybrid-compress mode), the circuitry 113 may be further configured to calculate an expected compressed size for both canned codes and dynamic codes after a first pass, and load a set of code tables and a compression stream header for a second pass that corresponds to either dynamic codes or canned codes based on a lower result of the respective calculated expected compressed sizes. Examples of the various modes of operation are described in additional detail below. The circuitry 113 may also be configured to set a maximum code length limit based on a user configurable parameter.

Embodiments of the hardware compressor 112 and/or circuitry 113 may be incorporated in or integrated with a processor including, for example, the core 990 (FIG. 6B), the cores 1102A-N (FIGS. 8, 12), the processor 1210 (FIG. 9), the co-processor 1245 (FIG. 9), the processor 1370

Figure 12:
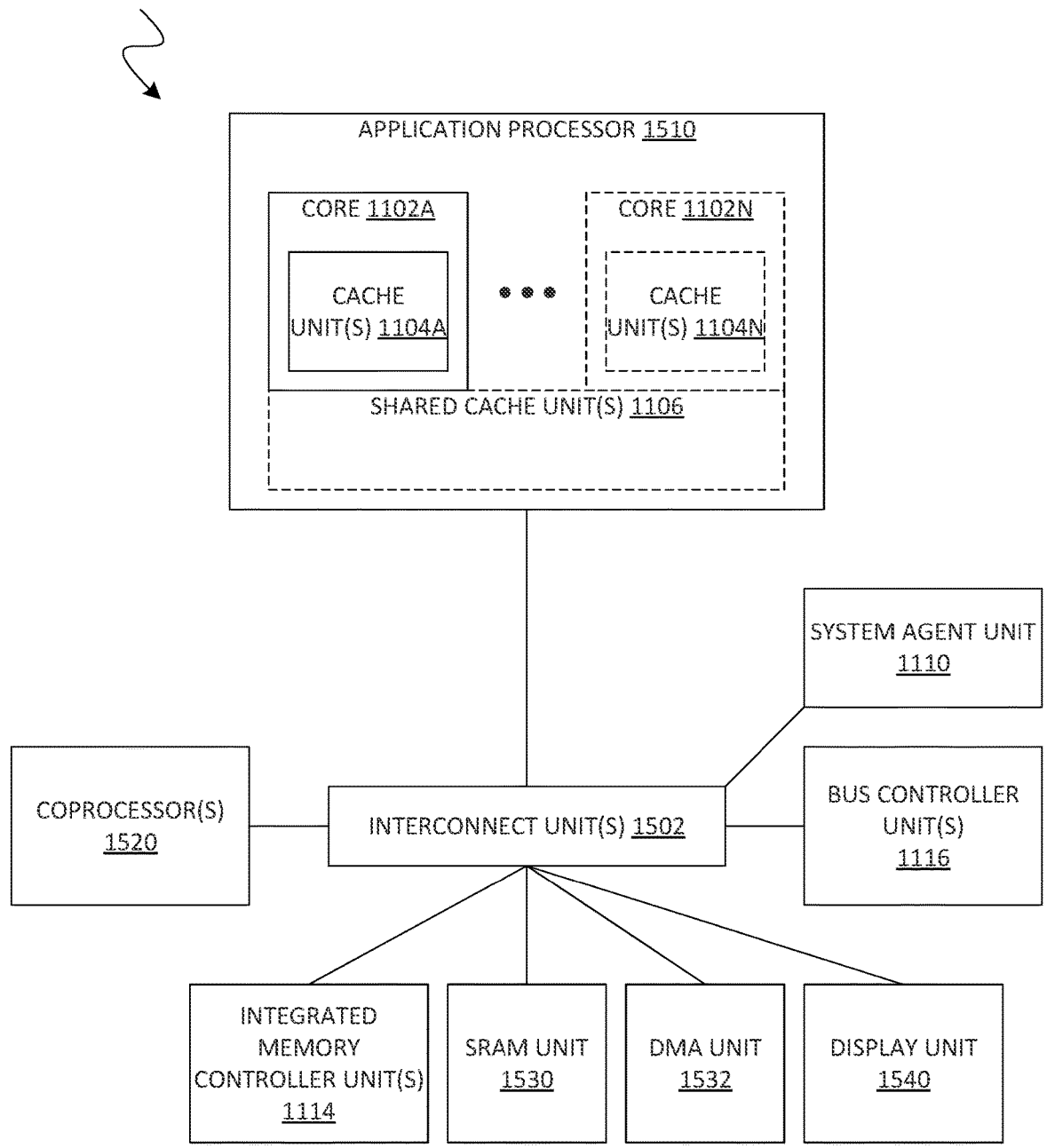
Figure 13:
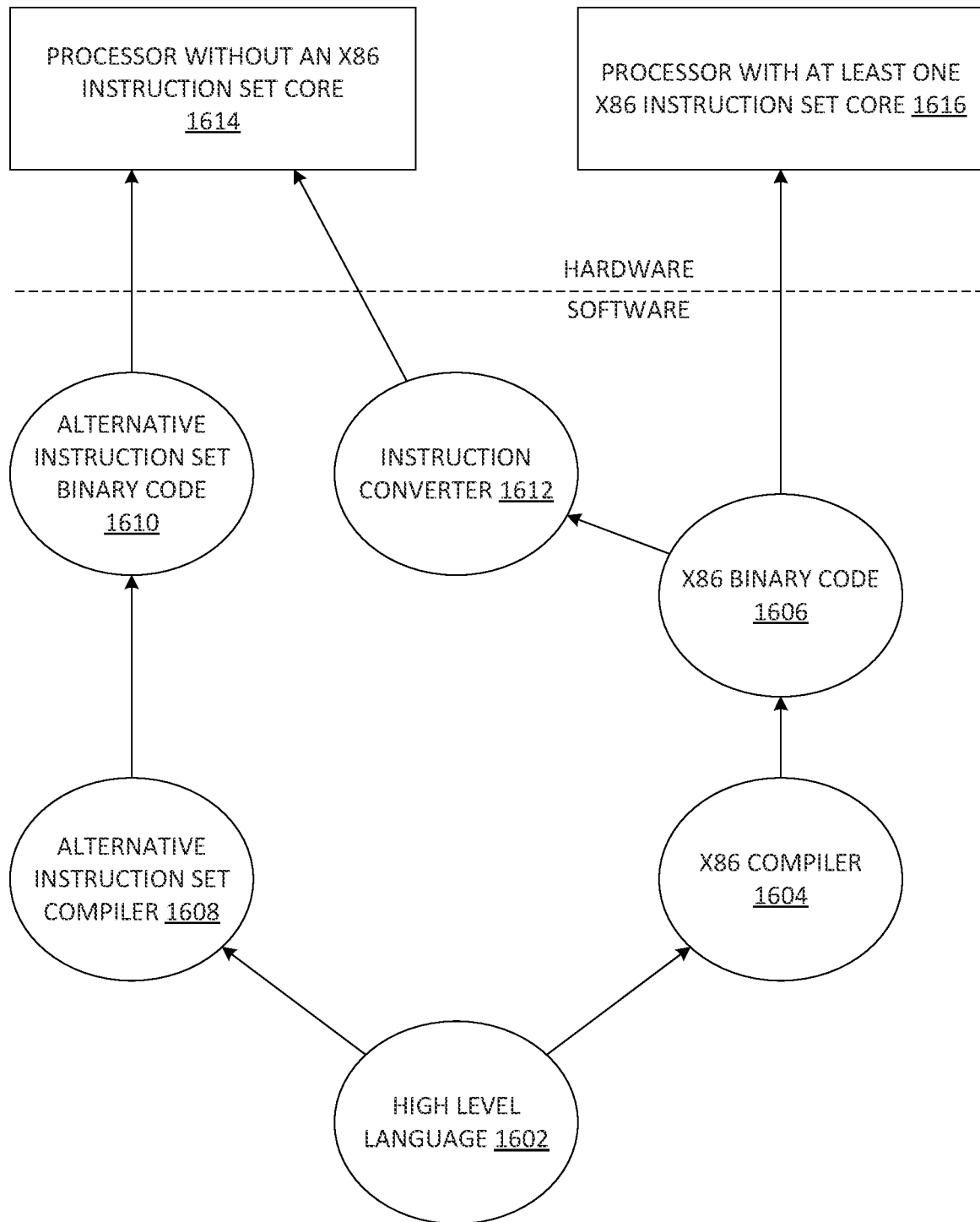
FIG. 13 is a block diagram contrasting the use of a software instruction converter to convert binary instructions in a source instruction set to binary instructions in a target instruction set according to embodiments of the invention.

(FIGS. 10-11), the processor/coprocessor 1380 (FIGS. 10-11), the coprocessor 1338 (FIGS. 10-11), the coprocessor 1520 (FIG. 12), and/or the processors 1614, 1616 (FIG. 13).

Figure 2A:
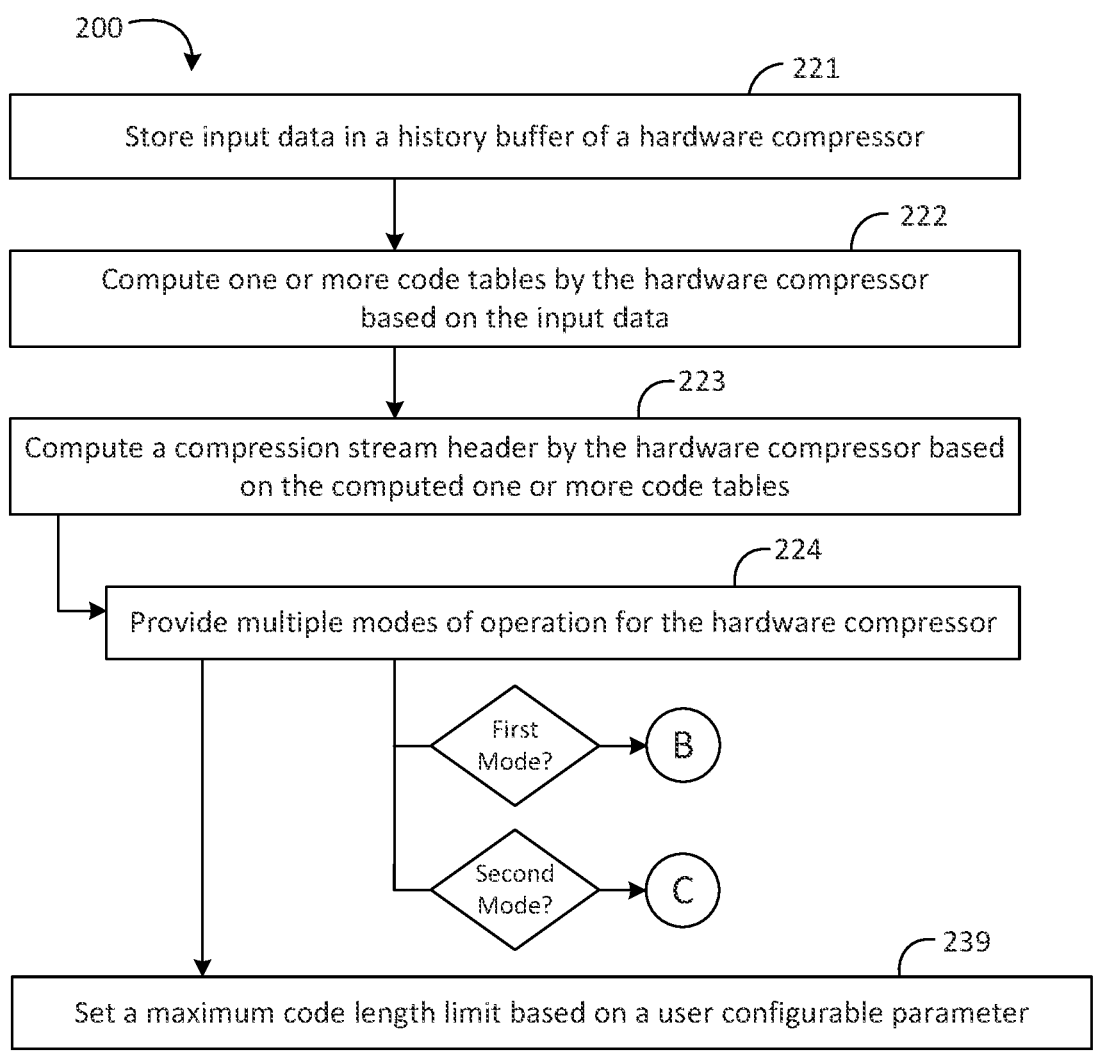
FIGS. 2A to 2C are flow diagrams of an example of a method according to an embodiment.
Figure 2B:
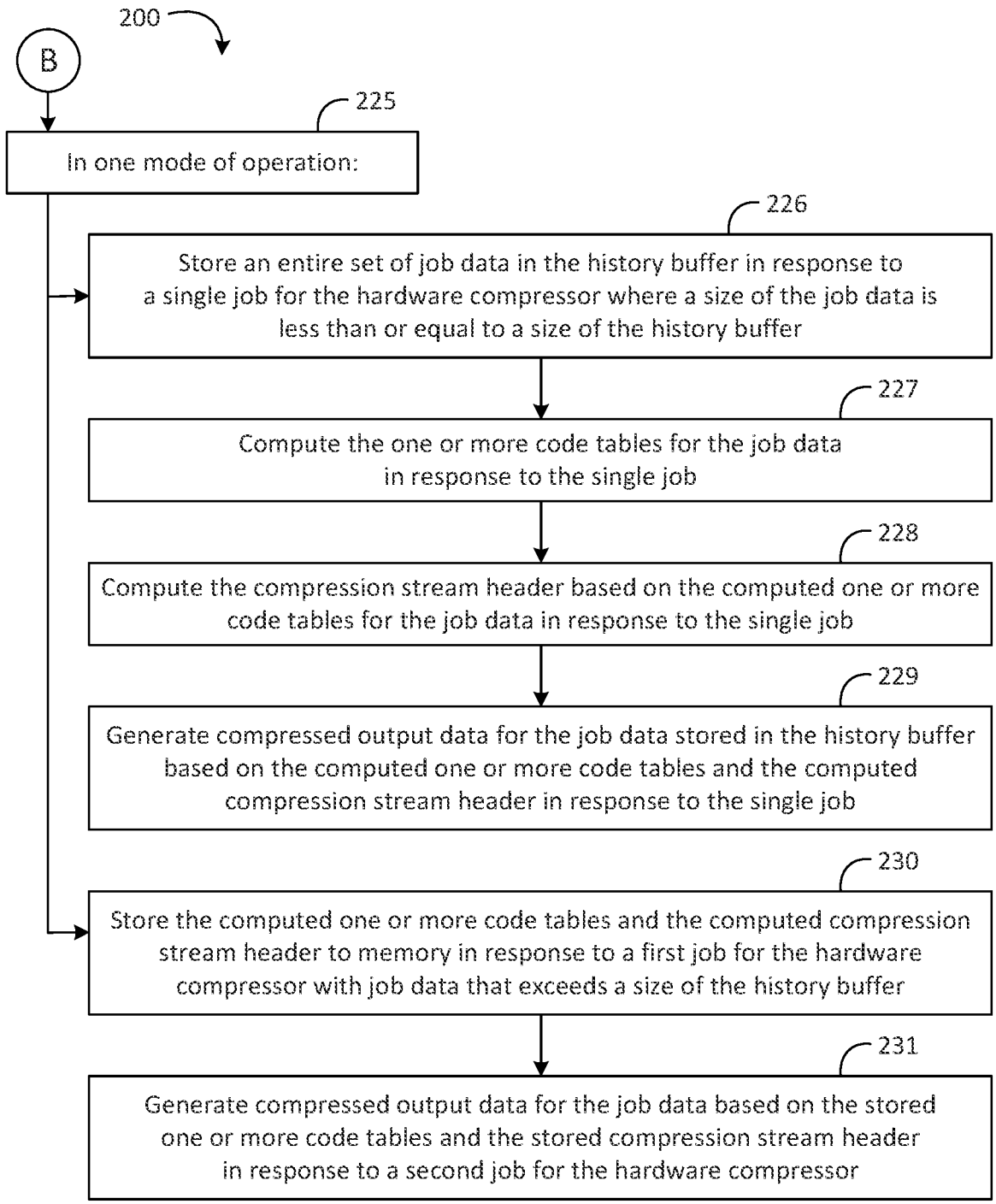
Figure 2C:
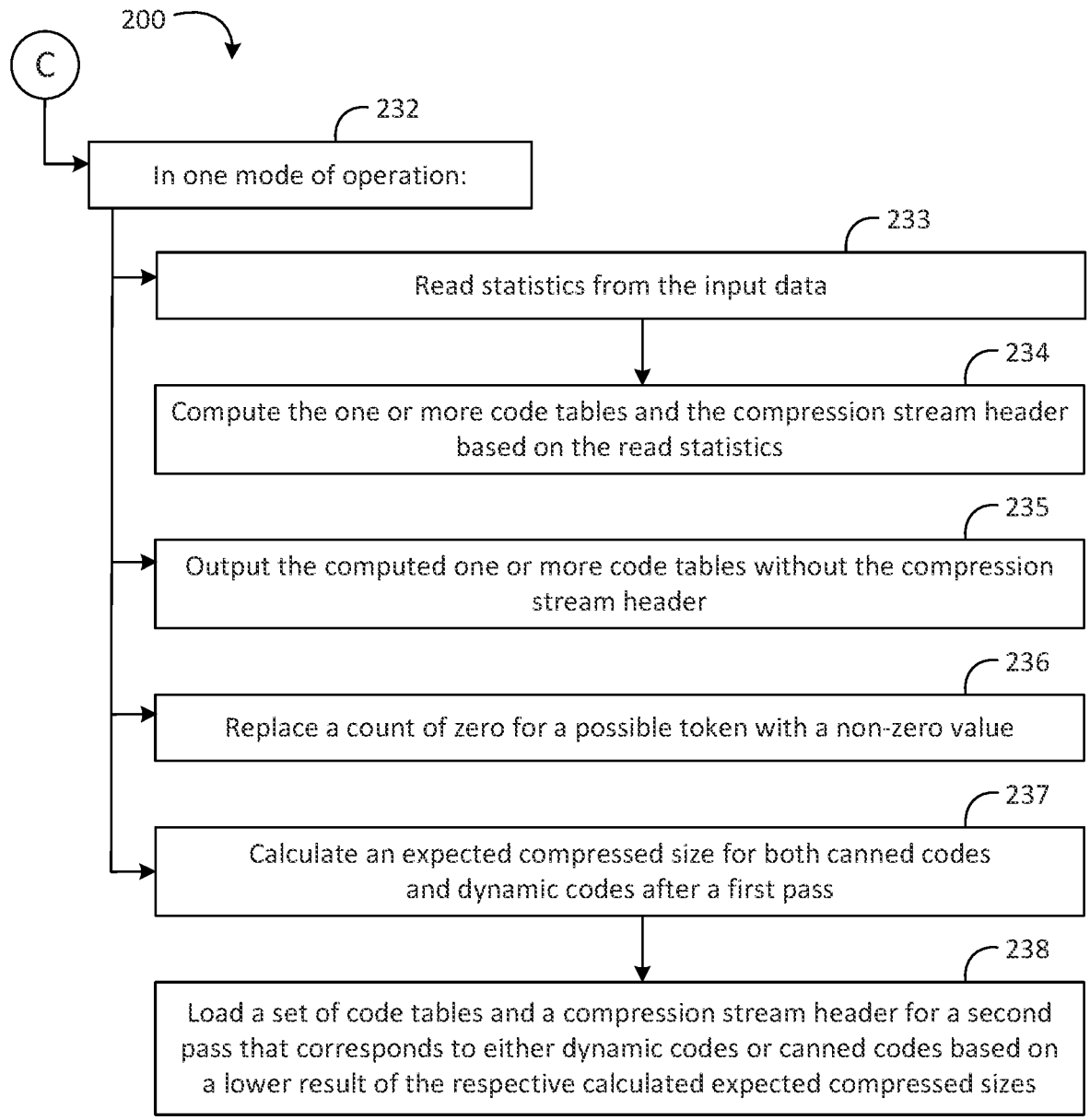

With reference to FIGS. 2A to 2C, an embodiment of a method 200 may include storing input data in a history buffer of a hardware compressor at box 221, computing one or more code tables by the hardware compressor based on the input data at box 222, and computing a compression stream header by the hardware compressor based on the computed one or more code tables at box 223. Some embodiments of the method 200 may further include providing multiple modes of operation for the hardware compressor at box 224. For example, in one mode of operation at box 225, the method 200 may include storing an entire set of job data in the history buffer in response to a single job for the hardware compressor where a size of the job data is less than or equal to a size of the history buffer at box 226, computing the one or more code tables for the job data in response to the single job at box 227, computing the compression stream header based on the computed one or more code tables for the job data in response to the single job at box 228, and generating compressed output data for the job data stored in the history buffer based on the computed one or more code tables and the computed compression stream header in response to the single job at box 229. In another mode of operation, the method 200 may include storing the computed one or more code tables and the computed compression stream header to memory in response to a first job for the hardware compressor with job data that exceeds a size of the history buffer at box 230, and generating compressed output data for the job data based on the stored one or more code tables and the stored compression stream header in response to a second job for the hardware compressor at box 231.

Some embodiments of the method 200, in one mode of operation at box 232, may further include reading statistics from the input data at box 233, and computing the one or more code tables and the compression stream header based on the read statistics at box 234. In another mode of operation, the method 200 may include outputting the computed one or more code tables without the compression stream header at box 235. In another mode of operation, the method 200 may include replacing a count of zero for a possible token with a non-zero value at box 236. In another mode of operation, the method 200 may include calculating an expected compressed size for both canned codes and dynamic codes after a first pass at box 237, and loading a set of code tables and a compression stream header for a second pass that corresponds to either dynamic codes or canned codes based on a lower result of the respective calculated expected compressed sizes at box 238. Some embodiments of the method 200 may further include setting a maximum code length limit based on a user configurable parameter at box 239.

As the input data is being processed, the data is being written into the history buffer and the statistics are being accumulated. After the history buffer fills up, the buffer wraps around and starts overwriting the oldest data. After all the data is processed, the code tables (e.g., Huffman tables) and headers (e.g., DEFLATE headers) are computed from the statistics. If the total input size is no bigger than the history buffer, in the one-descriptor mode, the hardware can operate to replay the history buffer back through the input (and back into the history buffer) to generate compressed output data.

Figure 3:
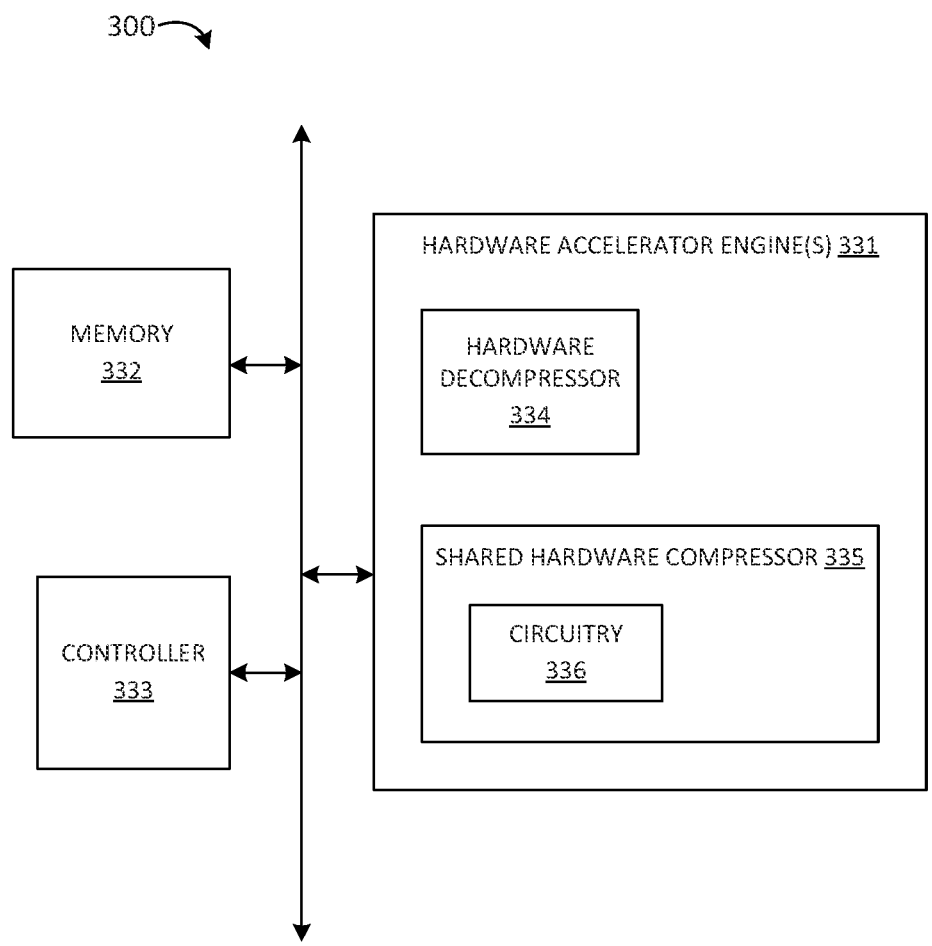
FIG. 3 is a block diagram of an example of an apparatus according to an embodiment.

With reference to FIG. 3, an embodiment of an apparatus 300 may include two or more hardware accelerator engines 331, memory 332 communicatively coupled to the two or more hardware accelerator engines 331 to store one or more jobs for the two or more hardware accelerator engines 331, and a controller 333 communicatively coupled to the memory 332 and the two or more hardware accelerator engines 331 to control the one or more jobs for the two or more hardware accelerator engines 331. Each of the two or more hardware accelerator engines 331 may include a hardware decompressor 334 and access to a hardware compressor 335 shared among the two or more hardware accelerator engines 331. The hardware compressor 335 may include circuitry to store input data in a history buffer, compute one or more code tables based on the input data, and compute a compression stream header based on the computed one or more code tables. In some embodiments, the circuitry 336 may be configured to provide multiple modes of operation for the hardware compressor 335.

In one mode of operation, for example, the circuitry 336 may be configured to store an entire set of job data in the history buffer in response to a single job for the hardware compressor 335 where a size of the job data is less than or equal to a size of the history buffer, compute the one or more code tables for the job data in response to the single job, compute the compression stream header based on the computed one or more code tables for the job data in response to the single job, and generate compressed output data for the job data stored in the history buffer based on the computed one or more code tables and the computed compression stream header in response to the single job. In another mode of operation, for example, the circuitry 336 may be configured to store the computed one or more code tables and the computed compression stream header to the memory in response to a first job for the hardware compressor 335 with job data that exceeds a size of the history buffer, and generate compressed output data for the job data based on the stored one or more code tables and the stored compression stream header in response to a second job for the hardware compressor 335.

In another mode of operation, for example, the circuitry 336 may be further configured to read statistics from the input data, and compute the one or more code tables and the compression stream header based on the read statistics. In another mode of operation, for example, the circuitry 336 may be configured to output the computed one or more code tables without the compression stream header. In some embodiments, in another mode of operation, the circuitry 336 may be configured to replace a count of zero for a possible token with a non-zero value. In another mode of operation, the circuitry 336 may be further configured to calculate an expected compressed size for both canned codes and dynamic codes after a first pass, and load a set of code tables and a compression stream header for a second pass that corresponds to either dynamic codes or canned codes based on the respective calculated expected compressed sizes. For example, the circuitry 336 may also be configured to set a maximum code length limit based on a user configurable parameter.

Embodiments of the hardware accelerator engines 331, the memory 332, and/or the controller 333 may be incorporated in or integrated with a processor including, for example, the core 990 (FIG. 6B), the cores 1102A-N (FIGS. 8, 12), the processor 1210 (FIG. 9), the co-processor 1245 (FIG. 9), the processor 1370 (FIGS. 10-11), the processor/coprocessor 1380 (FIGS. 10-11), the coprocessor 1338 (FIGS. 10-11), the coprocessor 1520 (FIG. 12), and/or the processors 1614, 1616 (FIG. 13).

Some embodiments provide technology for efficient and flexible DEFLATE header and Huffman code generation. In some systems, a compression accelerator may perform the matching and encoding, but the computation of the Huffman tables may be performed by a host CPU. For example, the software issues one job to compress the data, generate no compressed output, and count how many times each output token (e.g., literals and match lengths, distances) appeared. The software then takes those statistics, computes the Huffman tables and the DEFLATE header, and then submits a second job to compress the same data a second time, but this time the compression accelerator outputs the generated tokens using the newly constructed Huffman tables.

The matching in the accelerator may be done against a sliding "history window" of the preceding N bytes. The DEFLATE standard supports a history of up to 32 KB but, to reduce the accelerator size, the accelerator may support a smaller history size (e.g., 4 KB). For example, a hardware accelerator needs enough on-die memory to store that much data, against which to make matches, but more on-die memory increases the area of the accelerator. In some systems, the matching in the accelerator is done fast enough that the matching may be done twice, rather than saving the results of the matching between passes.

As noted above, a traditional approach is that the first pass through the data generates some form of intermediate format output in addition to accumulating the statistics. The second pass then transcodes this intermediate format data using the newly generated Huffman tables. Generating a stream of intermediate format tokens, which are then transcoded after calculation of the Huffman tables is a suitable arrangement for a two-descriptor mode (in this case, a "match descriptor" and a "transcode descriptor"). To do both operations together as a single descriptor, however, storage may be needed in the accelerator for those intermediate format tokens (e.g., in addition to the history buffer, which is needed for the matching). Some embodiments may perform the matching for both passes through the hardware in the one-descriptor mode, as long as the size is small enough, advantageously avoiding the overhead of storing the intermediate tokens by taking advantage of the input data already stored in the history buffer.

Some embodiments may provide hardware support in a compression engine to create the Huffman tables and DEFLATE header. Advantageously, some embodiments may provide an interface to the compression engine that is efficient from a performance point of view, and also efficient from a silicon area point of view, while allowing a great deal of flexibility for software to utilize the compression engine for various different usages. Some embodiments of a hardware compressor may include a hardware Huffman table generator and a hardware DEFLATE header generator, and may support multiple modes of operation to provide efficient and flexible utilization of the various hardware components of the hardware compressor. Non-limiting examples of operation modes for the Huffman table/Header generator include a one-descriptor mode, a two-descriptor mode, a statistics-input mode, a no-header mode, a complete-tree mode, and a hybrid-compress mode.

Figure 4:
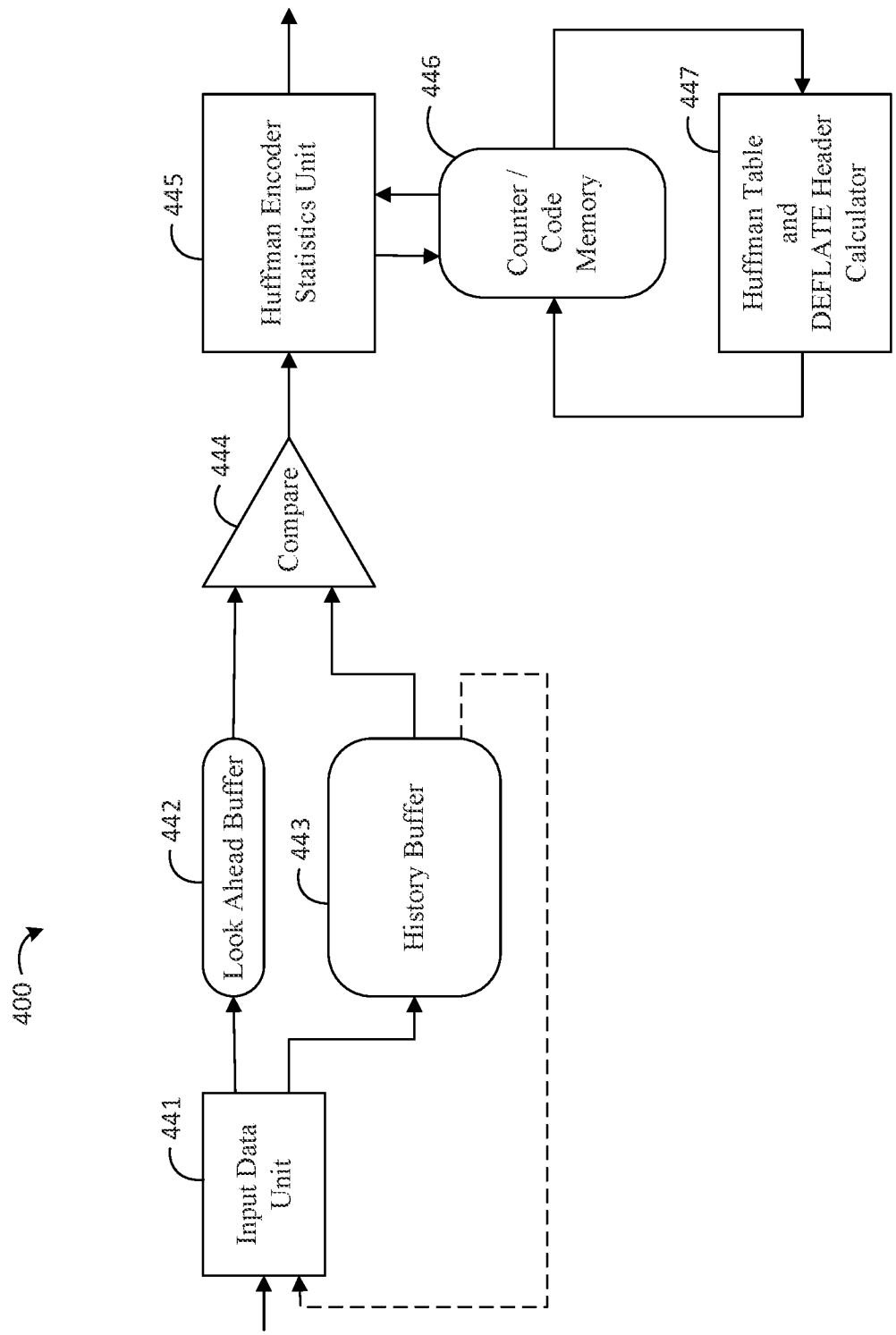
FIG. 4 is a block diagram of an example of a hardware compressor according to an embodiment.

With reference to FIG. 4, an embodiment of hardware compressor 400 may include an input data unit 441, a look ahead buffer 442, a history buffer 443, compare logic 444, a Huffman encoder statistics unit 445, a counter/code memory 446, and a Huffman table and DEFLATE header calculator 447, coupled as shown. The look ahead buffer 442 contains the next series of input bytes, and the history buffer 443 contains the previous 4 KB of the input. The compare logic 444 tries to find a match between the new data (from the look-ahead buffer 442) and the old data (from the history buffer 443). The comparison generates a stream of tokens (e.g., matches of the form <length, relative distance> or unmatched literal bytes) that go to the Huffman unit 445.

In the first pass, the Huffman unit 445 increment counters, and in the second pass, it uses the counter memory 446 to load the Huffman tables (created by the Huffman table calculator 447) to Huffman encode the stream of tokens. The local counter/code memory 446 has as many rows as there are symbols, and each entry can be viewed as either a counter which is incremented during the first pass or a variable-length code for that symbol that the encoder unit 445 uses for the second pass encoding. Advantageously, performing the Huffman table and DEFLATE header calculations in hardware decreases the CPU load and reduces latency.

For scenarios where the one-descriptor mode is applicable, embodiments of the hardware compressor 400 further reduces the latency as compared to both two-descriptor mode scenarios or software generation. Advantageously, embodiments may provide the one-descriptor mode with almost no additional area cost. Many memory systems may utilize a 4 KB page size. Embodiments of a hardware compressor with a 4 KB history buffer may advantageously support memory compression usage (e.g., page-level compression managed by system software) in the one-descriptor mode, with significant reduction in latency.

Figure 5:
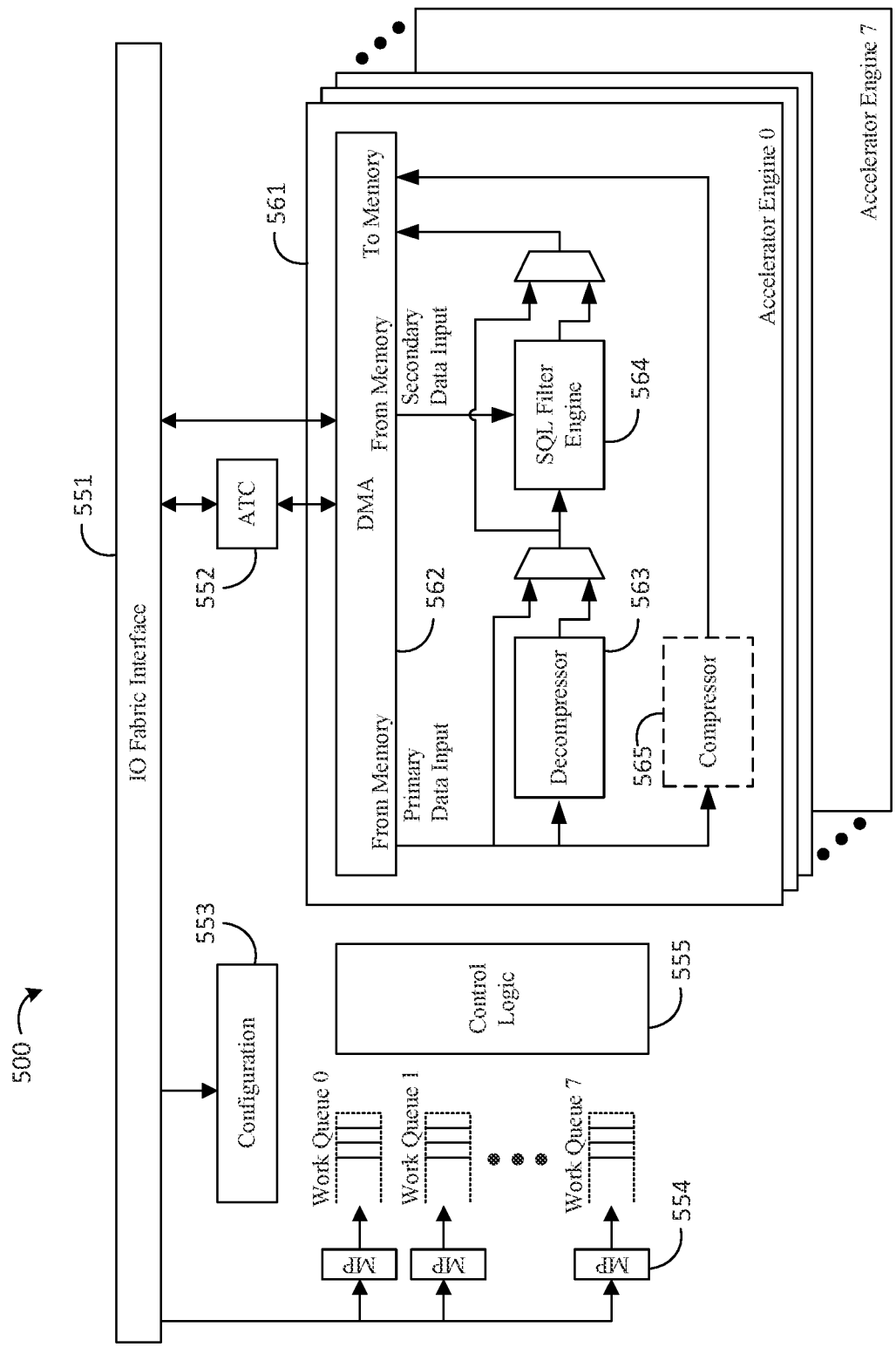
FIG. 5 is a block diagram of an example of a hardware accelerator according to an embodiment.

With reference to FIG. 5, an embodiment of a hardware accelerator 500 may include an IO fabric interface 551, an address translation cache (ATC) 552, a configuration module 553, and two or more memory mapped I/O (MMIO) portals (MP) 554 providing work queues to control logic 555, coupled as shown. The hardware accelerator 500 may further include two or more acceleration engines 561 communicatively coupled to the I/O fabric interface 551, the ATC 552, the configuration module 553, and the control logic 555. Each of the acceleration engines 561 may include a direct memory access (DMA) interface 562, a hardware decompressor 563, a structured query language (SQL) filter engine 564, and access to a shared hardware compressor 565, coupled as shown. For example, the hardware accelerator 500 may include two compressor cores shared dynamically across of the acceleration engines 561.

For example, the hardware compressor 565 may include one or more features of the embodiments described herein. In particular, embodiments of the hardware compressor 565 may include a history buffer, a look ahead buffer, compare logic, a Huffman encoder statistics unit, counter/code memory, Huffman table calculation logic, and DEFLATE header calculation logic, coupled as shown in FIG. 4. The hardware compressor 565 may be configured to support multiple mode of operation including for example, a one-descriptor mode, a two-descriptor mode, a statistics-input mode, a no-header mode, a complete-tree mode, and a hybrid-compress mode. The hardware compressor 565 may also be configured to set a maximum code-length limit based on a user configurable parameter (e.g., set via the configuration module 553).

One-Descriptor Mode Examples

The one-descriptor mode provides a simplified flow for the software. The software submits a single job and gets the compressed data out from the hardware compressor. In this case, the hardware performs both passes as part of the same job. The history buffer memory is utilized to store the input data between passes, advantageously providing one-descriptor compression with essentially no area cost. Note that the one-descriptor mode can only be used for data no bigger than the history buffer size. Some embodiments may provide a history buffer size which is the same size as a typical memory page (e.g., 4 KB).

In one-descriptor mode, because the input is not bigger than the history buffer, the history buffer contains the entire input. After the hardware compressor computes the Huffman tables, rather than writing the tables out, the tables can be used directly for the second pass. The input data is read out of the history buffer (e.g., see the dashed in FIG. 4) and fed back in as if it were normal input data. The re-use of the input data stored in the history buffer allows the hardware compressor to do two passes through the data and generate the final Huffman encoded token stream, advantageously without increasing the area footprint and with no wasted mesh/memory bandwidth.

Two-Descriptor Mode Examples

For the two-descriptor mode, the software submits a first job for the first pass. In the first pass, rather than writing the statistics to the output (e.g., for the software to compute the Huffman tables and DEFLATE header), embodiments of the hardware compressor take the statistics, compute the Huffman Tables, compute the DEFLATE header, and then write the information needed for the second pass to memory (e.g., after the first pass has updated the counters, the hardware Huffman table calculation logic will take the counters, compute the Huffman tables, and write those back into the counter memory). In some embodiments, the computed Huffman tables may be written to output. The software then submits a second job for the second pass to generate the compressed output. Advantageously, the software no longer has to do the relatively expensive calculations (e.g., software cost is typically >50K cycles per block) for the tables or the header, saving appreciable time and latency, particularly for smaller buffers. Embodiments of an accelerator engine may support a batch mode where software can submit both descriptors as a batch with a flag that there is a fence (e.g., because job2 uses the results of job1), further reducing latency.

Statistics-Input Mode Examples

In statistics-input mode, the hardware compressor reads the statistics from the input (e.g., rather than generating the statistics itself from matches), computes the tables and header, and then write that information to memory. The statistics-input mode can be used, for example, to offload the table/header generation for a software matcher operating at a higher level of compression, or with a larger history buffer size (e.g. 32 KB).

No-header Mode Examples

In the No-Header Mode, Some Embodiments May Use the Table Generation Functionality for non-DEFLATE usages (e.g., such as proprietary formats), or Huffman encoding of literals (e.g., as in ZSTANDARD). Other standards may not use the DEFLATE, but may use the Huffman tables. The time to sort and construct optimal Huffman trees is substantial in software, and embodiments of the hardware compressor may offload this task even for non-DEFLATE usages.

Complete-Tree Mode Examples

Normally, Huffman tokens that have a zero count (e.g., aren't being used) do not get a Huffman code assigned to them, which results in a more efficient table. In some cases, however, the user may want to operate in "semi-dynamic" mode. In the semi-dynamic mode, the first block is done in a fully dynamic manner, as described previously. But then if the data in the following blocks has similar statistics, the user can decrease the latency by using the same Huffman tables as for the first block. This avoids one pass on all but the first block.

The issue is that there is no guarantee that a token that happened to not appear in the first block won't appear in a subsequent block (e.g., this scenario may be rare, but not impossible). In order to deal with this, the tables created by the initial block need to be "complete", where all of the possible tokens need to have valid codes created for them.

To support this, some embodiments of the hardware compressor have a setting that causes a zero count for any possible token to be replaced with a count of one (e.g., or another small non-zero value). Replacing a count of zero for a possible token with a count of one results in such tokens being assigned a large code. But if this token appears later, a valid output is generated.

Max Code-Length Limit Parameter Examples

The DEFLATE standard requires that all Huffman codes be no longer than 15 bits in length. In some cases, the statistics could result in a set of tables containing longer codes. Because of this, the hardware compressor has logic to adjust the Huffman trees so as to limit the codes to a length of 15.

In some cases, the user may want to limit the maximum code size to a smaller value. For example, if the decoder was processing one token per cycle and trying to speculatively decode a second token at various bit offsets from the main token, decompression latency may be improved (e.g., at the cost of slightly larger compressed size) by limiting the Huffman token length during compression based on the decompressor design.

Other compression standards may also have smaller limits of the code lengths. These other standards may utilize embodiments of the hardware accelerator to generate Huffman codes by specifying an appropriate maximum code-length limit parameter. For example, a configuration tool or interface may provide a user configurable parameter to allow the user to set a maximum code length limit.

Hybrid-Compress Mode Examples

DEFLATE prescribes dynamic Huffman coded blocks. However, other methods can be employed such as semi-dynamic described above, or "canned" codes. For example, a canned code is where a code is determined a priori that works well for some type of data (e.g. HTML). Rather than compute codes for each data block, the canned code may be used. Compatibility may be broken with DEFLATE by storing a single copy the header separately, and starting with the first symbol. Some embodiments of an accelerator engine may support canned mode.

Because the header size is on the order of ten of bytes (e.g., typically <100 bytes), the size of the header is often immaterial for large buffers. For sizes of data <=4 KB, however, using canned codes may give a net better size than dynamic codes in some cases. That is, the increased size due to using less-optimized Huffman codes may be smaller than the size of the header. To know which one is better, some embodiments may do a first pass and then decide whether to compress in the second pass with canned codes or dynamic codes.

In some embodiments, if the hardware compressor provides the statistics and the tree/header after the first pass, then the software can calculate the expected size with both canned codes and dynamic codes, and then load the appropriate set of tables for the second pass (e.g., with a DEFLATE header for dynamic codes, or a null header for canned codes).

Those skilled in the art will appreciate that a wide variety of devices may benefit from the foregoing embodiments. The following exemplary core architectures, processors, and computer architectures are non-limiting examples of devices that may beneficially incorporate embodiments of the technology described herein.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 6A is a block diagram illustrating both an exemplary in-order pipeline and an exemplary register renaming, out-of-order issue/execution pipeline according to embodiments of the invention. FIG. 6B is a block diagram illustrating both an exemplary embodiment of an in-order architecture core and an exemplary register renaming, out-of-order issue/execution architecture core to be included in a processor according to embodiments of the invention. The solid lined boxes in FIGS. 6A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 6A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 6B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression engine, coprocessor core, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (or decoder) may decode instructions, and generate as an output one or more micro-operations, micro-code entry points, microinstructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a write mask registers unit, and a scalar registers unit. These register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/ vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 934/974 and a shared L2 cache unit 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

FIGS. 7A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 7A is a block diagram of a single processor core, along with its connection to the on-die interconnect network 1002 and with its local subset of the Level 2 (L2) cache 1004, according to embodiments of the invention. In one embodiment, an instruction decoder 1000 supports the x86 instruction set with a packed data instruction set extension. An L1 cache 1006 allows low-latency accesses to cache memory into the scalar and vector units. While in one embodiment (to simplify the design), a scalar unit 1008 and a vector unit 1010 use separate register sets (respectively, scalar registers 1012 and vector registers 1014) and data transferred between them is written to memory and then read back in from a level 1 (L1) cache 1006, alternative embodiments of the invention may use a different approach (e.g., use a single register set or include a communication path that allow data to be transferred between the two register files without being written and read back).

The local subset of the L2 cache 1004 is part of a global L2 cache that is divided into separate local subsets, one per processor core. Each processor core has a direct access path to its own local subset of the L2 cache 1004. Data read by a processor core is stored in its L2 cache subset 1004 and can be accessed quickly, in parallel with other processor cores accessing their own local L2 cache subsets. Data written by a processor core is stored in its own L2 cache subset 1004 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 7B is an expanded view of part of the processor core in FIG. 7A according to embodiments of the invention. FIG. 7B includes an L1 data cache 1006A part of the L1 cache 1006, as well as more detail regarding the vector unit 1010 and the vector registers 1014. Specifically, the vector unit 1010 is a 16-wide vector processing unit (VPU) (see the 16-wide ALU 1028), which executes one or more of integer, single-precision float, and double-precision float instructions. The VPU supports swizzling the register inputs with swizzle unit 1020, numeric conversion with numeric convert units 1022A-B, and replication with replication unit 1024 on the memory input. Write mask registers 1026 allow predicating resulting vector writes.

Figure 8:
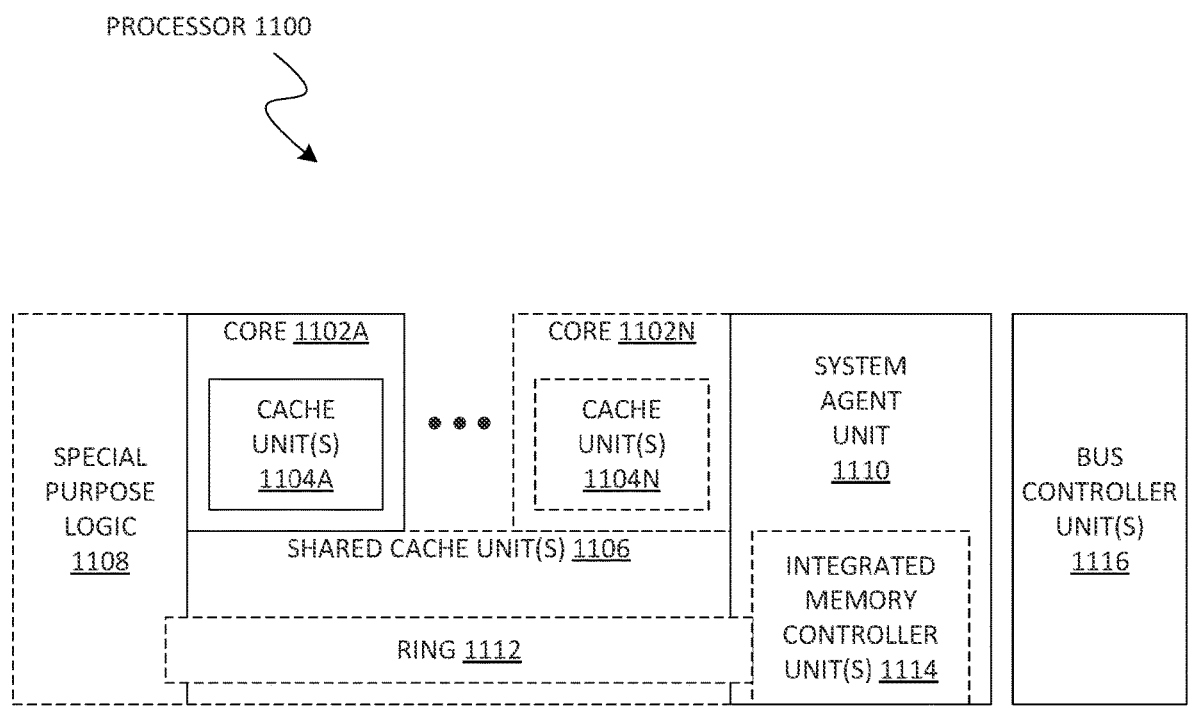
FIG. 8 is a block diagram of a processor that may have more than one core, may have an integrated memory controller, and may have integrated graphics according to embodiments of the invention.

FIG. 8 is a block diagram of a processor 1100 that may have more than one core, may have an integrated memory controller, and may have integrated graphics according to embodiments of the invention. The solid lined boxes in FIG. 8 illustrate a processor 1100 with a single core 1102A, a system agent 1110, a set of one or more bus controller units 1116, while the optional addition of the dashed lined boxes illustrates an alternative processor 1100 with multiple cores 1102A-N, a set of one or more integrated memory controller unit(s) 1114 in the system agent unit 1110, and special purpose logic 1108.

Thus, different implementations of the processor 1100 may include: 1) a CPU with the special purpose logic 1108 being integrated graphics and/or scientific (throughput) logic (which may include one or more cores), and the cores 1102A-N being one or more general purpose cores (e.g., general purpose in-order cores, general purpose out-of-order cores, a combination of the two); 2) a coprocessor with the cores 1102A-N being a large number of special purpose cores intended primarily for graphics and/or scientific (throughput); and 3) a coprocessor with the cores 1102A-N being a large number of general purpose in-order cores. Thus, the processor 1100 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1100 may be a part of and/or may be implemented on one or more substrates using any of a number of process technologies, such as, for example, BiCMOS, CMOS, or NMOS.

The memory hierarchy includes one or more levels of respective caches 1104A-N within the cores 1102A-N, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof. While in one embodiment a ring based interconnect unit 1112 interconnects the integrated graphics logic 1108, the set of shared cache units 1106, and the system agent unit 1110/integrated memory controller unit(s) 1114, alternative embodiments may use any number of well-known techniques for interconnecting such units. In one embodiment, coherency is maintained between one or more cache units 1106 and cores 1102-A-N.

In some embodiments, one or more of the cores 1102A-N are capable of multi-threading. The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the integrated graphics logic 1108. The display unit is for driving one or more externally connected displays.

The cores 1102A-N may be homogenous or heterogeneous in terms of architecture instruction set; that is, two or more of the cores 1102A-N may be capable of execution the same instruction set, while others may be capable of executing only a subset of that instruction set or a different instruction set.

Exemplary Computer Architectures

FIGS. 9-12 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 9:
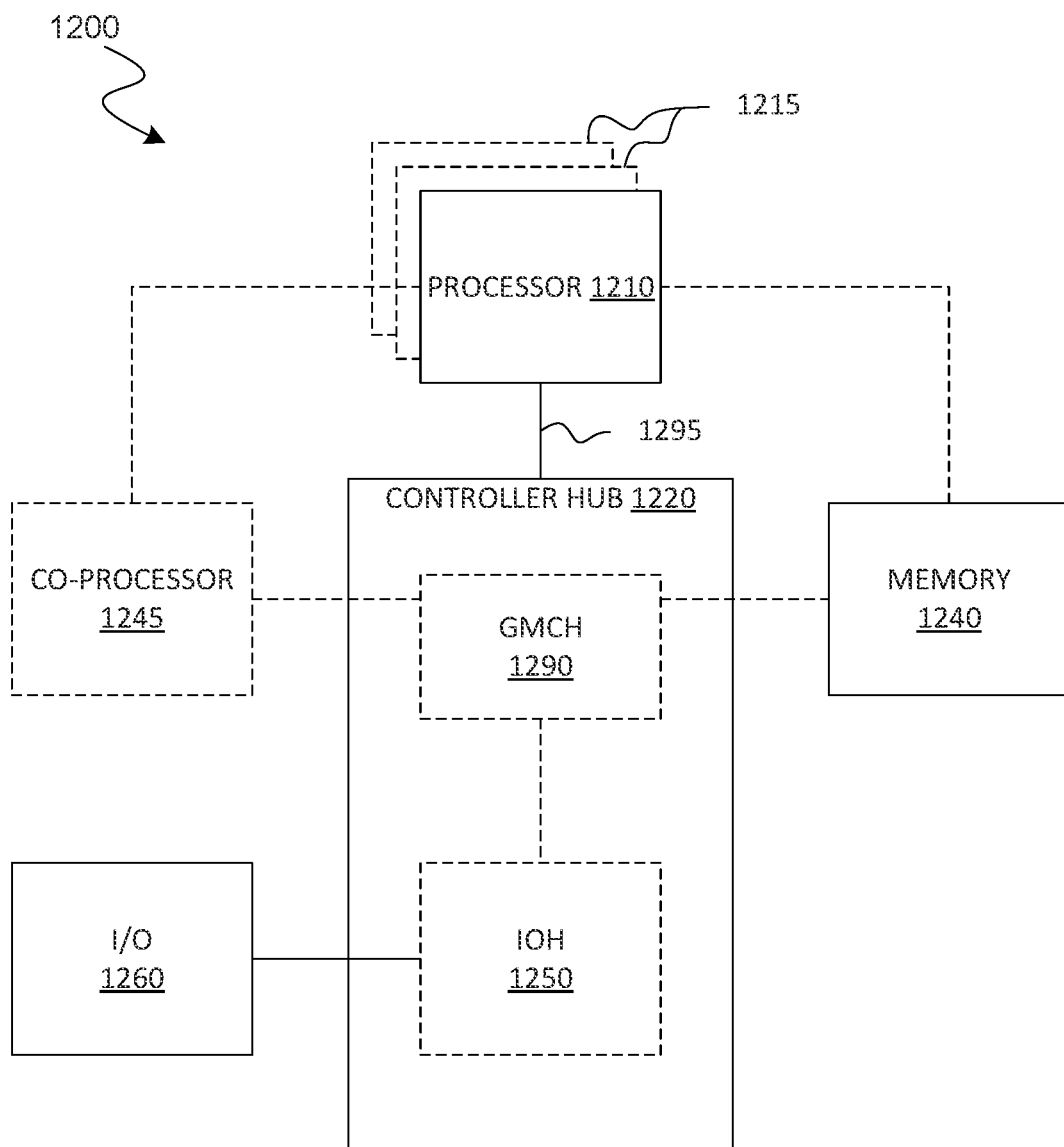
FIGS. 9-12 are block diagrams of exemplary computer architectures.

Referring now to FIG. 9, shown is a block diagram of a system 1200 in accordance with one embodiment of the present invention. The system 1200 may include one or more processors 1210, 1215, which are coupled to a controller hub 1220. In one embodiment the controller hub 1220 includes a graphics memory controller hub (GMCH) 1290 and an Input/Output Hub (IOH) 1250 (which may be on separate chips); the GMCH 1290 includes memory and graphics controllers to which are coupled memory 1240 and a coprocessor 1245; the IOH 1250 couples input/output (I/O) devices 1260 to the GMCH 1290. Alternatively, one or both of the memory and graphics controllers are integrated within the processor (as described herein), the memory 1240 and the coprocessor 1245 are coupled directly to the processor 1210, and the controller hub 1220 in a single chip with the IOH 1250.

The optional nature of additional processors 1215 is denoted in FIG. 9 with broken lines. Each processor 1210, 1215 may include one or more of the processing cores described herein and may be some version of the processor 1100.

The memory 1240 may be, for example, dynamic random access memory (DRAM), phase change memory (PCM), or a combination of the two. For at least one embodiment, the controller hub 1220 communicates with the processor(s) 1210, 1215 via a multi-drop bus, such as a frontside bus (FSB), point-to-point interface such as QuickPath Interconnect (QPI), or similar connection 1295.

In one embodiment, the coprocessor 1245 is a special-purpose processor, such as, for example, a high-throughput MIC processor, a network or communication processor, compression engine, graphics processor, GPGPU, embedded processor, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor(s) 1245 accept and execute the received coprocessor instructions.

Figure 10:
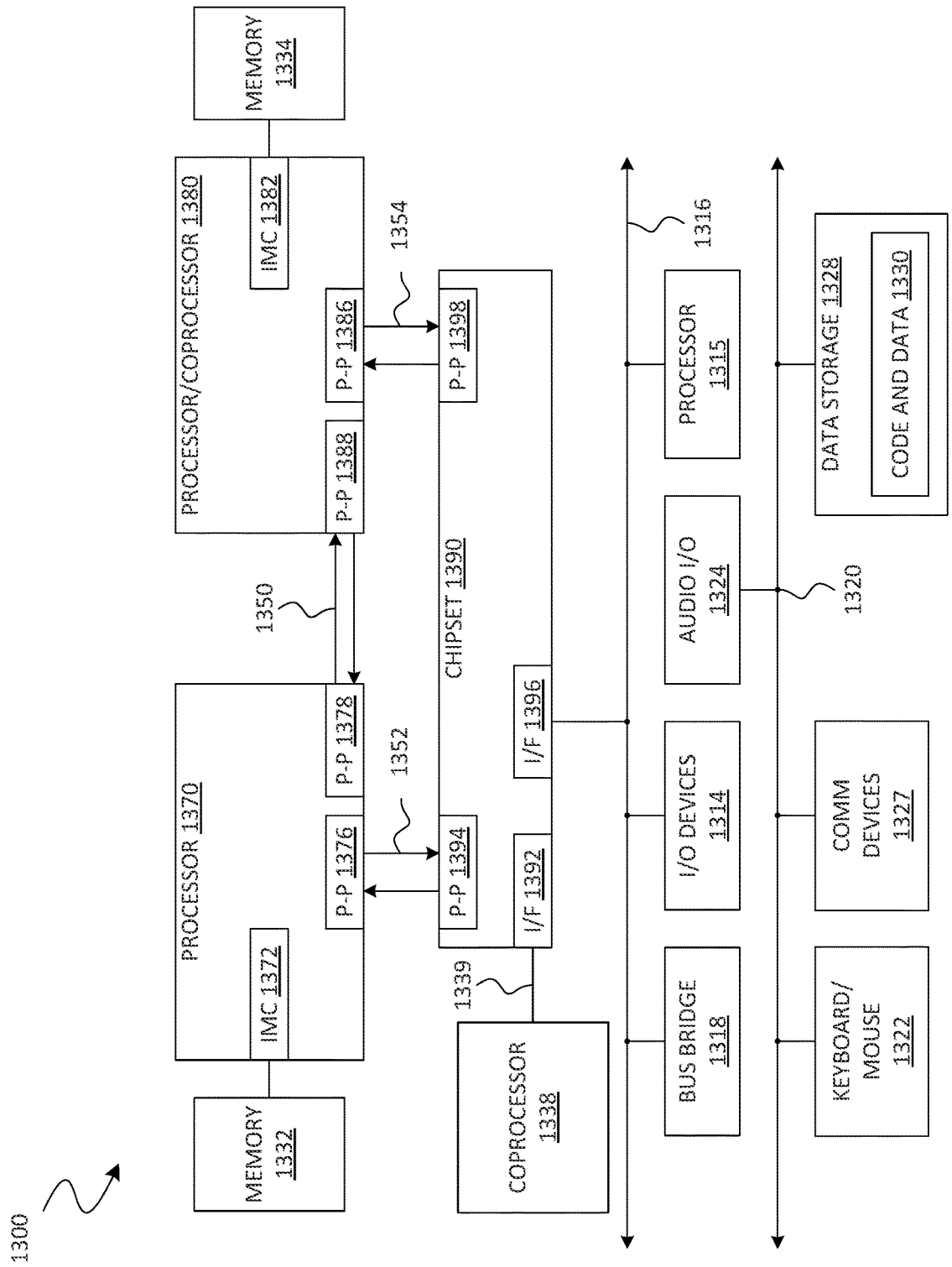

Referring now to FIG. 10, shown is a block diagram of a first more specific exemplary system 1300 in accordance with an embodiment of the present invention. As shown in FIG. 10, multiprocessor system 1300 is a point-to-point interconnect system, and includes a first processor 1370 and a second processor 1380 coupled via a point-to-point interconnect 1350. Each of processors 1370 and 1380 may be some version of the processor 1100. In one embodiment of the invention, processors 1370 and 1380 are respectively processors 1210 and 1215, while coprocessor 1338 is coprocessor 1245. In another embodiment, processors 1370 and 1380 are respectively processor 1210 coprocessor 1245.

Processors 1370 and 1380 are shown including integrated memory controller (IMC) units 1372 and 1382, respectively. Processor 1370 also includes as part of its bus controller units point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 10, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1339 and an interface 1392. In one embodiment, the coprocessor 1338 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present invention is not so limited.

As shown in FIG. 10, various I/O devices 1314 may be coupled to first bus 1316, along with a bus bridge 1318 which couples first bus 1316 to a second bus 1320. In one embodiment, one or more additional processor(s) 1315, such as coprocessors, high-throughput MIC processors, GPGPU's, accelerators (such as, e.g., graphics accelerators or digital signal processing (DSP) units), field programmable gate arrays, or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a storage unit 1328 such as a disk drive or other mass storage device which may include instructions/code and data 1330, in one embodiment. Further, an audio I/O 1324 may be coupled to the second bus 1320. Note that other architectures are possible. For example, instead of the point-to-point architecture of FIG. 10, a system may implement a multi-drop bus or other such architecture.

Figure 11:
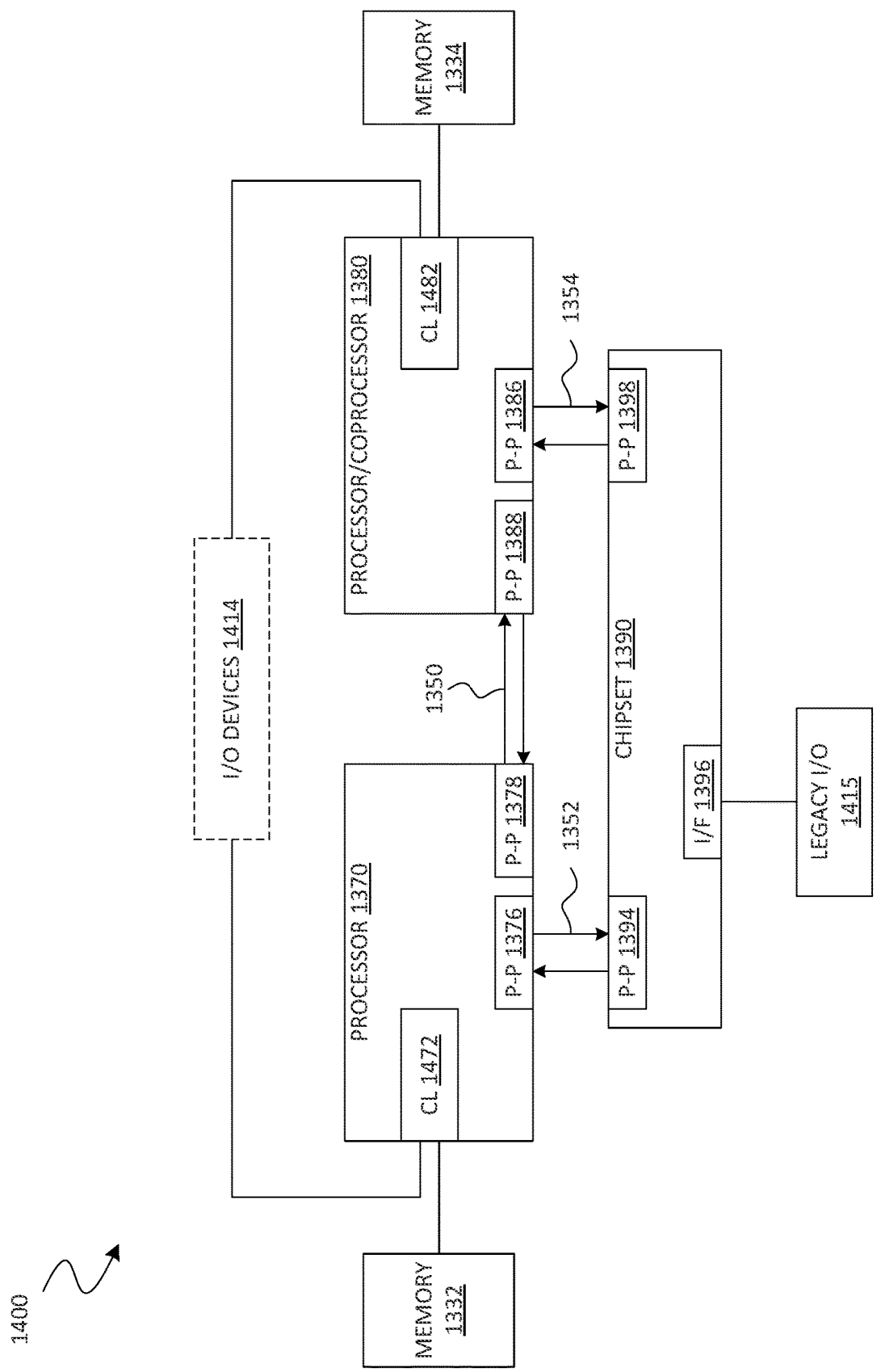

Referring now to FIG. 11, shown is a block diagram of a second more specific exemplary system 1400 in accordance with an embodiment of the present invention Like elements in FIGS. 10 and 11 bear like reference numerals, and certain aspects of FIG. 10 have been omitted from FIG. 11 in order to avoid obscuring other aspects of FIG. 11.

FIG. 11 illustrates that the processors 1370, 1380 may include integrated memory and I/O control logic ("CL") 1472 and 1482, respectively. Thus, the CL 1472, 1482 include integrated memory controller units and include I/O control logic. FIG. 11 illustrates that not only are the memories 1332, 1334 coupled to the CL 1472, 1482, but also that I/O devices 1414 are also coupled to the control logic 1472, 1482. Legacy I/O devices 1415 are coupled to the chipset 1390.

Referring now to FIG. 12, shown is a block diagram of a SoC 1500 in accordance with an embodiment of the present invention. Similar elements in FIG. 8 bear like reference numerals. Also, dashed lined boxes are optional features on more advanced SoCs. In FIG. 12, an interconnect unit(s) 1502 is coupled to: an application processor 1510 which includes a set of one or more cores 1102A-N and shared cache unit(s) 1106; a system agent unit 1110; a bus controller unit(s) 1116; an integrated memory controller unit(s) 1114; a set or one or more coprocessors 1520 which may include integrated graphics logic, an image processor, an audio processor, and a video processor; an static random access memory (SRAM) unit 1530; a direct memory access (DMA) unit 1532; and a display unit 1540 for coupling to one or more external displays. In one embodiment, the coprocessor(s) 1520 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1330 illustrated in FIG. 10, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (including binary translation, code morphing, etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 13 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 13 shows a program in a high level language 1602 may be compiled using an x86 compiler 1604 to generate x86 binary code 1606 that may be natively executed by a processor with at least one x86 instruction set core 1616. The processor with at least one x86 instruction set core 1616 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 13 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

Techniques and architectures for hardware compression are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Additional Notes and Examples

Example 1 includes an integrated circuit, comprising a hardware compressor to compress data, the hardware compressor including circuitry to store input data in a history buffer, compute one or more code tables based on the input data, and compute a compression stream header based on the computed one or more code tables.

Example 2 includes the integrated circuit of Example 1, wherein the circuitry is further to provide multiple modes of operation for the hardware compressor.

Example 3 includes the integrated circuit of Example 2, wherein, in one mode of operation, the circuitry is further to store an entire set of job data in the history buffer in response to a single job for the hardware compressor where a size of the job data is less than or equal to a size of the history buffer, compute the one or more code tables for the job data in response to the single job, compute the compression stream header based on the computed one or more code tables for the job data in response to the single job, and generate compressed output data for the job data stored in the history buffer based on the computed one or more code tables and the computed compression stream header in response to the single job.

Example 4 includes the integrated circuit of any of Examples 2 to 3, wherein, in one mode of operation, the circuitry is further to store the computed one or more code tables and the computed compression stream header to memory in response to a first job for the hardware compressor with job data that exceeds a size of the history buffer, and generate compressed output data for the job data based on the stored one or more code tables and the stored compression stream header in response to a second job for the hardware compressor.

Example 5 includes the integrated circuit of any of Examples 2 to 4, wherein, in one mode of operation, the circuitry is further to read statistics from the input data, and compute the one or more code tables and the compression stream header based on the read statistics.

Example 6 includes the integrated circuit of any of Examples 2 to 5, wherein, in one mode of operation, the circuitry is further to output the computed one or more code tables without the compression stream header.

Example 7 includes the integrated circuit of any of Examples 2 to 6, wherein, in one mode of operation, the circuitry is further to replace a count of zero for a possible token with a non-zero value.

Example 8 includes the integrated circuit of any of Examples 2 to 7, wherein, in one mode of operation, the circuitry is further to calculate an expected compressed size for both canned codes and dynamic codes after a first pass, and load a set of code tables and a compression stream header for a second pass that corresponds to either dynamic codes or canned codes based on a lower result of the respective calculated expected compressed sizes.

Example 9 includes the integrated circuit of any of Examples 2 to 8, wherein the circuitry is further to set a maximum code length limit based on a user configurable parameter.

Example 10 includes a method, comprising storing input data in a history buffer of a hardware compressor, computing one or more code tables by the hardware compressor based on the input data, and computing a compression stream header by the hardware compressor based on the computed one or more code tables.

Example 11 includes the method of Example 10, further comprising providing multiple modes of operation for the hardware compressor.

Example 12 includes the method of Example 11, wherein, in one mode of operation, the method further comprises storing an entire set of job data in the history buffer in response to a single job for the hardware compressor where a size of the job data is less than or equal to a size of the history buffer, computing the one or more code tables for the job data in response to the single job, computing the compression stream header based on the computed one or more code tables for the job data in response to the single job, and generating compressed output data for the job data stored in the history buffer based on the computed one or more code tables and the computed compression stream header in response to the single job.

Example 13 includes the method of any of Examples 11 to 12, wherein, in one mode of operation, the method further comprises storing the computed one or more code tables and the computed compression stream header to memory in response to a first job for the hardware compressor with job data that exceeds a size of the history buffer, and generating compressed output data for the job data based on the stored one or more code tables and the stored compression stream header in response to a second job for the hardware compressor.

Example 14 includes the method of any of Examples 11 to 13, wherein, in one mode of operation, the method further comprises reading statistics from the input data, and computing the one or more code tables and the compression stream header based on the read statistics.

Example 15 includes the method of any of Examples 11 to 14, wherein, in one mode of operation, the method further comprises outputting the computed one or more code tables without the compression stream header.

Example 16 includes the method of any of Examples 11 to 15, wherein, in one mode of operation, the method further comprises replacing a count of zero for a possible token with a non-zero value.

Example 17 includes the method of any of Examples 11 to 16, wherein, in one mode of operation, the method further comprises calculating an expected compressed size for both canned codes and dynamic codes after a first pass, and loading a set of code tables and a compression stream header for a second pass that corresponds to either dynamic codes or canned codes based on a lower result of the respective calculated expected compressed sizes.

Example 18 includes the method of any of Examples 11 to 17, further comprising setting a maximum code length limit based on a user configurable parameter.

Example 19 includes an apparatus, comprising two or more hardware accelerator engines, memory communicatively coupled to the two or more hardware accelerator engines to store one or more jobs for the two or more hardware accelerator engines, and a controller communicatively coupled to the memory and the two or more hardware accelerator engines to control the one or more jobs for the two or more hardware accelerator engines, wherein each of the two or more hardware accelerator engines includes a hardware decompressor and access to a hardware compressor shared among the two or more hardware accelerator engines, the hardware compressor including circuitry to store input data in a history buffer, compute one or more code tables based on the input data, and compute a compression stream header based on the computed one or more code tables.

Example 20 includes the apparatus of Example 19, wherein the circuitry is further to provide multiple modes of operation for the hardware compressor.

Example 21 includes the apparatus of Example 20, wherein, in one mode of operation, the circuitry is further to store an entire set of job data in the history buffer in response to a single job for the hardware compressor where a size of the job data is less than or equal to a size of the history buffer, compute the one or more code tables for the job data in response to the single job, compute the compression stream header based on the computed one or more code tables for the job data in response to the single job, and generate compressed output data for the job data stored in the history buffer based on the computed one or more code tables and the computed compression stream header in response to the single job.

Example 22 includes the apparatus of any of Examples 20 to 21, wherein, in one mode of operation, the circuitry is further to store the computed one or more code tables and the computed compression stream header to the memory in response to a first job for the hardware compressor with job data that exceeds a size of the history buffer, and generate compressed output data for the job data based on the stored one or more code tables and the stored compression stream header in response to a second job for the hardware compressor.

Example 23 includes the apparatus of any of Examples 20 to 22, wherein, in one mode of operation, the circuitry is further to read statistics from the input data, and compute the one or more code tables and the compression stream header based on the read statistics.

Example 24 includes the apparatus of any of Examples 20 to 23, wherein, in one mode of operation, the circuitry is further to output the computed one or more code tables without the compression stream header.

Example 25 includes the apparatus of any of Examples 20 to 24, wherein, in one mode of operation, the circuitry is further to replace a count of zero for a possible token with a non-zero value.

Example 26 includes the apparatus of any of Examples 20 to 25, wherein, in one mode of operation, the circuitry is further to calculate an expected compressed size for both canned codes and dynamic codes after a first pass, and load a set of code tables and a compression stream header for a second pass that corresponds to either dynamic codes or canned codes based on the respective calculated expected compressed sizes.

Example 27 includes the apparatus of any of Examples 20 to 26, wherein the circuitry is further to set a maximum code length limit based on a user configurable parameter.

Example 28 includes a compression apparatus, comprising means for storing input data in a history buffer of a hardware compressor, means for computing one or more code tables by the hardware compressor based on the input data, and means for computing a compression stream header by the hardware compressor based on the computed one or more code tables.

Example 29 includes the apparatus of Example 28, further comprising means for providing multiple modes of operation for the hardware compressor.

Example 30 includes the apparatus of Example 29, wherein, in one mode of operation, the apparatus further comprises means for storing an entire set of job data in the history buffer in response to a single job for the hardware compressor where a size of the job data is less than or equal to a size of the history buffer, means for computing the one or more code tables for the job data in response to the single job, means for computing the compression stream header based on the computed one or more code tables for the job data in response to the single job, and means for generating compressed output data for the job data stored in the history buffer based on the computed one or more code tables and the computed compression stream header in response to the single job.

Example 31 includes the apparatus of any of Examples 29 to 30, wherein, in one mode of operation, the apparatus further comprises means for storing the computed one or more code tables and the computed compression stream header to memory in response to a first job for the hardware compressor with job data that exceeds a size of the history buffer, and means for generating compressed output data for the job data based on the stored one or more code tables and the stored compression stream header in response to a second job for the hardware compressor.

Example 32 includes the apparatus of any of Examples 29 to 31, wherein, in one mode of operation, the apparatus further comprises means for reading statistics from the input data, and means for computing the one or more code tables and the compression stream header based on the read statistics.

Example 33 includes the apparatus of any of Examples 29 to 32, wherein, in one mode of operation, the apparatus further comprises means for outputting the computed one or more code tables without the compression stream header.

Example 34 includes the apparatus of any of Examples 29 to 33, wherein, in one mode of operation, the apparatus further comprises means for replacing a count of zero for a possible token with a non-zero value.

Example 35 includes the apparatus of any of Examples 29 to 34, wherein, in one mode of operation, the apparatus further comprises means for calculating an expected compressed size for both canned codes and dynamic codes after a first pass, and means for loading a set of code tables and a compression stream header for a second pass that corresponds to either dynamic codes or canned codes based on a lower result of the respective calculated expected compressed sizes.

Example 36 includes the apparatus of any of Examples 29 to 35, further comprising means for setting a maximum code length limit based on a user configurable parameter.

Example 37 includes at least one non-transitory machine readable medium comprising a plurality of instructions that, in response to being executed on a computing device, cause the computing device to store input data in a history buffer of a hardware compressor, compute one or more code tables by the hardware compressor based on the input data, and compute a compression stream header by the hardware compressor based on the computed one or more code tables.

Example 38 includes the at least one non-transitory machine readable medium of Example 37, comprising a plurality of further instructions that, in response to being executed on the computing device, cause the computing device to provide multiple modes of operation for the hardware compressor.

Example 39 includes the at least one non-transitory machine readable medium of Example 38, comprising a plurality of further instructions that in one mode of operation, in response to being executed on the computing device, cause the computing device to store an entire set of job data in the history buffer in response to a single job for the hardware compressor where a size of the job data is less than or equal to a size of the history buffer, compute the one or more code tables for the job data in response to the single job, compute the compression stream header based on the computed one or more code tables for the job data in response to the single job, and generate compressed output data for the job data stored in the history buffer based on the computed one or more code tables and the computed compression stream header in response to the single job.

Example 40 includes the at least one non-transitory machine readable medium of any of Examples 38 to 39, comprising a plurality of further instructions that in one mode of operation, in response to being executed on the computing device, cause the computing device to store the computed one or more code tables and the computed compression stream header to memory in response to a first job for the hardware compressor with job data that exceeds a size of the history buffer, and generate compressed output data for the job data based on the stored one or more code tables and the stored compression stream header in response to a second job for the hardware compressor.

Example 41 includes the at least one non-transitory machine readable medium of any of Examples 38 to 40, comprising a plurality of further instructions that in one mode of operation, in response to being executed on the computing device, cause the computing device to read statistics from the input data, and compute the one or more code tables and the compression stream header based on the read statistics.

Example 42 includes the at least one non-transitory machine readable medium of any of Examples 38 to 41, comprising a plurality of further instructions that in one mode of operation, in response to being executed on the computing device, cause the computing device to output the computed one or more code tables without the compression stream header.

Example 43 includes the at least one non-transitory machine readable medium of any of Examples 38 to 42, comprising a plurality of further instructions that in one mode of operation, in response to being executed on the computing device, cause the computing device to replace a count of zero for a possible token with a non-zero value.

Example 44 includes the at least one non-transitory machine readable medium of any of Examples 38 to 43, comprising a plurality of further instructions that in one mode of operation, in response to being executed on the computing device, cause the computing device to calculate an expected compressed size for both canned codes and dynamic codes after a first pass, and load a set of code tables and a compression stream header for a second pass that corresponds to either dynamic codes or canned codes based on a lower result of the respective calculated expected compressed sizes.

Example 45 includes the at least one non-transitory machine readable medium of any of Examples 38 to 44, comprising a plurality of further instructions that, in response to being executed on the computing device, cause the computing device to set a maximum code length limit based on a user configurable parameter.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit, comprising:
an input/output (I/O) fabric interface; and
a hardware compressor coupled to the I/O fabric interface, the hardware compressor including circuitry to:
store input data in a history buffer;
compute one or more code tables based on the input data;
compute a compression stream header based on the computed one or more code tables; and
provide multiple modes of operation for the hardware compressor, wherein, in one mode of operation, the circuitry is further to:
store an entire set of job data in the history buffer in response to a single job for the hardware compressor where a size of the job data is less than or equal to a size of the history buffer;
compute the one or more code tables for the job data in response to the single job;
compute the compression stream header based on the computed one or more code tables for the job data in response to the single job; and
generate compressed output data for the job data stored in the history buffer based on the computed one or more code tables and the computed compression stream header in response to the single job.

2. The integrated circuit of claim 1, wherein, in one mode of operation, the circuitry is further to:
store the computed one or more code tables and the computed compression stream header to memory in response to a first job for the hardware compressor with job data that exceeds a size of the history buffer; and
generate compressed output data for the job data based on the stored one or more code tables and the stored compression stream header in response to a second job for the hardware compressor.

3. The integrated circuit of claim 1, wherein, in one mode of operation, the circuitry is further to:
read statistics from the input data; and
compute the one or more code tables and the compression stream header based on the read statistics.

4. The integrated circuit of claim 1, wherein, in one mode of operation, the circuitry is further to:
output the computed one or more code tables without the compression stream header.

5. The integrated circuit of claim 1, wherein, in one mode of operation, the circuitry is further to:
replace a count of zero for a possible token with a non-zero value.

6. The integrated circuit of claim 1, wherein, in one mode of operation, the circuitry is further to:

calculate an expected compressed size for both canned codes and dynamic codes after a first pass; and load a set of code tables and a compression stream header for a second pass that corresponds to either dynamic codes or canned codes based on a lower result of the respective calculated expected compressed sizes.

7. The integrated circuit of claim 1, wherein the circuitry is further to:

set a maximum code length limit based on a user configurable parameter.

8. A method, comprising:

storing input data in a history buffer of a hardware compressor;

computing one or more code tables by the hardware compressor based on the input data;

computing a compression stream header by the hardware compressor based on the computed one or more code tables; and providing multiple modes of operation for the hardware compressor, wherein, in one mode of operation, the method further comprises:

storing an entire set of job data in the history buffer in response to a single job for the hardware compressor where a size of the job data is less than or equal to a size of the history buffer;

computing the one or more code tables for the job data in response to the single job;

computing the compression stream header based on the computed one or more code tables for the job data in response to the single job; and generating compressed output data for the job data stored in the history buffer based on the computed one or more code tables and the computed compression stream header in response to the single job.

9. The method of claim 8, wherein, in one mode of operation, the method further comprises:

storing the computed one or more code tables and the computed compression stream header to memory in response to a first job for the hardware compressor with job data that exceeds a size of the history buffer; and generating compressed output data for the job data based on the stored one or more code tables and the stored compression stream header in response to a second job for the hardware compressor.

10. The method of claim 8, wherein, in one mode of operation, the method further comprises:

reading statistics from the input data; and computing the one or more code tables and the compression stream header based on the read statistics.

11. The method of claim 8, wherein, in one mode of operation, the method further comprises:

outputting the computed one or more code tables without the compression stream header.

12. The method of claim 8, wherein, in one mode of operation, the method further comprises:

replacing a count of zero for a possible token with a non-zero value.

13. The method of claim 8, wherein, in one mode of operation, the method further comprises:

calculating an expected compressed size for both canned codes and dynamic codes after a first pass; and loading a set of code tables and a compression stream header for a second pass that corresponds to either dynamic codes or canned codes based on a lower result of the respective calculated expected compressed sizes.

14. The method of claim 8, further comprising:

setting a maximum code length limit based on a user configurable parameter.

15. An apparatus, comprising:

two or more hardware accelerator engines;

memory communicatively coupled to the two or more hardware accelerator engines to store one or more jobs for the two or more hardware accelerator engines; and a controller communicatively coupled to the memory and the two or more hardware accelerator engines to control the one or more jobs for the two or more hardware accelerator engines;

wherein each of the two or more hardware accelerator engines includes a hardware decompressor and access to a hardware compressor shared among the two or more hardware accelerator engines, the hardware compressor including circuitry to:

store input data in a history buffer;

compute one or more code tables based on the input data; and compute a compression stream header based on the computed one or more code tables.

16. The apparatus of claim 15, wherein the circuitry is further to:

provide multiple modes of operation for the hardware compressor.

17. The apparatus of claim 16, wherein, in one mode of operation, the circuitry is further to:

store an entire set of job data in the history buffer in response to a single job for the hardware compressor where a size of the job data is less than or equal to a size of the history buffer;

compute the one or more code tables for the job data in response to the single job;

compute the compression stream header based on the computed one or more code tables for the job data in response to the single job; and generate compressed output data for the job data stored in the history buffer based on the computed one or more code tables and the computed compression stream header in response to the single job.

18. The apparatus of claim 16, wherein, in one mode of operation, the circuitry is further to:

store the computed one or more code tables and the computed compression stream header to the memory in response to a first job for the hardware compressor with job data that exceeds a size of the history buffer; and generate compressed output data for the job data based on the stored one or more code tables and the stored compression stream header in response to a second job for the hardware compressor.

19. The apparatus of claim 17, wherein, in one mode of operation, the circuitry is further to:

read statistics from the input data; and compute the one or more code tables and the compression stream header based on the read statistics.

20. The apparatus of claim 16, wherein, in one mode of operation, the circuitry is further to:

output the computed one or more code tables without the compression stream header.

21. The apparatus of claim 16, wherein, in one mode of operation, the circuitry is further to:

replace a count of zero for a possible token with a non-zero value.

* * * * *